United States Patent [19]

Nagata et al.

[11] Patent Number: 5,070,359
[45] Date of Patent: Dec. 3, 1991

[54] PRESSURE DEVELOPING APPARATUS

[75] Inventors: Osamu Nagata; Keiji Seo, both of Nagoya, Japan

[73] Assignee: Brother Kogyo Kabushiki Kaisha, Japan

[21] Appl. No.: 597,891

[22] Filed: Oct. 15, 1990

[30] Foreign Application Priority Data

Oct. 16, 1989 [JP] Japan ............................ 1-120645[U]
Oct. 16, 1989 [JP] Japan ............................ 1-268350
Oct. 16, 1989 [JP] Japan ............................ 1-268351
Oct. 16, 1989 [JP] Japan ............................ 1-268352

[51] Int. Cl.$^5$ ............................................. G03B 27/52
[52] U.S. Cl. ....................................... 355/27; 355/100
[58] Field of Search .................. 355/27, 28, 100, 106, 355/277, 278; 354/304; 100/160, 168, 176

[56] References Cited

U.S. PATENT DOCUMENTS

| | | | |
|---|---|---|---|
| 4,920,375 | 4/1990 | Akao et al. | 355/27 |
| 4,945,374 | 7/1990 | Yamamoto et al. | 355/27 X |
| 4,945,381 | 7/1990 | Yamagata et al. | 355/27 |

Primary Examiner—L. T. Hix
Assistant Examiner—D. Rutledge
Attorney, Agent, or Firm—Kane, Dalsimer, Sullivan, Kurucz, Levy, Eisele and Richard

[57] ABSTRACT

In an image formation system such as color copying machine, a micro-capsule paper as a photosensitive and pressure-sensitive medium and a developer paper as an image recording medium are fed in an overlapped state in a gap defined between two rollers having different diameters disposed in a pressure developing unit of the image formation system. In the pressure developing unit, the gap between two rollers is pressure adjusted by the cam assembly which comprises a cam support member disposed to be movable in directions contacting to and being separated from one roller, a plurality of cams mounted to the cam support member, an elastically deformable member supported by the frame member for applying pressure to the cam by the elastic deformation caused by the contact to the cams and a pressure transferring member mounted to the cam support member for transferring the pressure caused by the pressure applying member to the one roller, thus uniformly adjusting the pressure distribution to the papers between two rollers. The distance between the cam support member and the pressure applying member be adjusted by disposing and adjusting the wedge member. The cams selectively operated in accordance with the sizes of the papers to be utilized.

14 Claims, 9 Drawing Sheets

PRESSURE DEVELOPING APPARATUS

BACKGROUND OF THE INVENTION

This invention relates to an image formation system such as copying machine and more particularly to a pressure developing unit of the image formation system for transferring and developing under pressure the image on a photosensitive and developing under pressure the image on a photosensitive and pressure-sensitive medium onto an image recording medium.

In the prior art, there is known a color copying machine in which a micro-capsule paper is exposed through an original, the micro-capsule paper being a photosensitive and pressure-sensitive medium having a surface on which is carried a micro-capsule including a color precursor and a photopolymerization initiator and having a mechanical strength which is varied in response to the light. The exposed micro-capsule paper and a developer paper as an image recording medium prepared by sticking a granular developer by a developer coating device on a surface of a carrier member such as an ordinal paper are fed into a pressure developing apparatus in which the exposed micro-capsule paper and the developer paper are tightly contacted under pressure. The micro-capsule having a weak mechanical strength is broken by the pressure, resulting in the flow-out of the color precursor contained in the micro-capsule, the flown precursor and the developer are reacted. In such manner, the developed color image is transferred on the developer paper and the developer paper after the pressure developing operation is fed to a heat fixing device to fix the color image on the developer paper.

The pressure developing apparatus of the character described above is usually composed of a plurality of rollers arranged to be rotatable about their rotation axes which are parallel with each other. A various kind of means for applying pressure to the rollers are well known.

One of known pressure applying means is of the type in which a large diameter roller having a high rigidity is utilized and such pressure developing apparatus is disclosed in the Japanese Patent Laid-Open Publication No. 63-262650.

Another one of known pressure applying means is of the type in which a small diameter roller having a low rigidity is supported at multiple points on a large diameter roller having a high rigidity and such pressure developing apparatus is disclosed in the U.S. Pat. No. 4,104,963.

In the pressure developing apparatus, in a case where a pressure is applied unevenly along the direction of the rotation axis of the roller, the paper to be developed may be crinkled or the paper may be unevenly developed. For this reason, in the former known pressure applying means, is utilized a roller of a shape having curvature directed in the rotation axis, or the rotation axes of the pressurizing roller and the pressurized roller are offset so as not to be parallel and the adjustment is carried out in accordance with the crossing angle therebetween. Furthermore, in the later known pressure applying means, pressures at the respective pressurizing points are adjusted by means of coil springs.

However, in the pressure distribution adjustment in the described known pressure developing apparatus, working processes of the complicated parts involve the increase of working cost, assembling cost and so on. The increasing of the constructional parts may result in high possibility of generation of accident and in an inadequate performance of the desired operations due to errors in manufacturing or working the same.

Furthermore, in another aspect, there is proposed a pressure developing apparatus in which the pressure application and distribution are adjusted by changing the paper supporting positions of the roller in accordance with the size of the papers such as A4 size (210×297 mm) or B5 size (182×257 mm). However, in such type pressure developing apparatus, the pressure distribution adjustment requires much time and labor, thus being inconvenient.

SUMMARY OF THE INVENTION

An object of this invention is to substantially eliminate the defects or drawbacks encountered in the prior art and to provide a pressure developing unit for an image formation system capable of adjusting the distribution of pressure applied to a photosensitive and pressure-sensitive medium and an image recording medium which pass the space defined between the first and second rollers disposed in the pressure developing apparatus regardless of the size of the photosensitive and pressure-sensitive medium and the image recording medium with improved reliability.

This and other objects can be achieved according to this invention by providing a pressure developing unit of an image formation system for developing and transferring an image under application of pressure comprising a frame member, a first roller supported to the frame member to be rotatable about an rotation axis thereof, a second roller supported to the frame member and having a rotation axis parallel to the rotation axis of the first roller to be rotatable about the rotation axis thereof, the second roller being disposed to be movable to a first position where the second roller contacts with the first roller and to a second position where the second roller separates from the first roller, a photosensitive and pressure-sensitive medium and an image recording medium being passed in an overlapped state while the second roller contacts with the first roller, and a cam assembly operatively supported to the frame member for applying pressure to the second roller, the cam assembly comprising cam support member disposed to be movable in directions approaching to and being separated from the second roller, a plurality of cams mounted to the cam support member, an elastically deformable member supported to the frame member for applying pressure to the cams by elastic deformation caused by contact to the cams and a pressure transferring member mounted to the cam support member for transferring the pressure caused by the pressure applying member.

In preferred embodiments, the cam support member comprises a cam shaft supported to the frame member, the pressure applying member comprises a cam follower shaft and a plurality of bearings mounted to the cam follower shaft at portions corresponding to locations of the cams mounted to the cam shaft, and the pressure transferring member comprises a plurality of bearings mounted to the cam shaft. The cams are mounted to the cam shaft in phase shifted state so as to selectively contact to corresponding bearings mounted to the cam follower shaft.

The cam assembly further comprises wedge means for adjusting a distance between the cam support member and the pressure applying member.

The pressure applying member may comprise a rod like member having both ends supported to the frame member and a plurality of bearings mounted to the rod like member, the rod like member being composed of a central portion and side portions on both sides of the central portion each having a cross sectional area smaller than that of the central portion and the bearings mounted respectively to the central portion and the both side portions of the rod like member.

The pressure transferring member may comprise a plurality of back-up rollers mounted to the cam shaft on both sides of the cams respectively to be rotatable about the cam shaft.

According to the pressure developing unit of this invention of the characters described above, in an image formation system such as copying machine, the microcapsule paper as a photosensitive and pressure-sensitive medium and the developer paper as an image recording medium are fed in an overlapped state in a gap defined between two rollers having different diameters disposed in the pressure developing unit of the image formation system. In the pressure developing unit, the gap between two rollers are pressure adjusted by the cam assembly which comprises a cam support member disposed to be movable in directions contacting to and being separated from one roller, a plurality of cams mounted to the cam support member, an elastically deformable member supported to the frame member for applying pressure to the cams by the elastic deformation caused by the contact to the cams and a pressure transferring member mounted to the cam support member for transferring the pressure caused by the pressure applying member to the one roller. In the preferred embodiments, the cam support member comprises a cam shaft supported to the frame member, the pressure applying member comprises a cam follower shaft and a plurality of bearings mounted to the cam follower shaft at portions corresponding to locations of the cams mounted to the cam shaft, and the pressure transferring member comprises a plurality of bearings mounted to the cam shaft. The cams are mounted to the cam shaft in phase shifted state so as to selectively contact to corresponding bearings mounted to the cam follower shaft, thus uniformly adjusting the pressure distribution to the papers between two rollers. The distance between the cam support member and the cam follower shaft can be adjusted by disposing and adjusting the wedge means.

As described hereinbefore, according to this invention, the return force for the deformation of the cam follower shaft is utilized as the pressure applying force to the roller of the pressure developing unit and the pressure distribution to the roller can be adjusted by adjusting the distance between the contour curve and the axis of the cam shaft at the press contact points of the bearings by the wedge means, so that the construction of the pressure developing unit can be made compact in comparison with the conventional structure of the pressure developing unit. Accordingly, the elements or parts constituting the pressure developing unit can be reduced, thus making compact the same with reduced weight. In addition, the manufacturing cost involving working and assembling costs can be reduced and the reduced utilization of the constructional elements results in the lowering of the generation of the faults of the pressure developing unit, thus being effective. Moreover, the working error in the cam producing process can be substantially solved by adjusting the wedge means, whereby the reliability of the pressure developing unit and hence the color copying machine can be significantly improved.

BRIEF DESCRIPTION OF THE DRAWINGS

For a better understanding of this invention and to show how the same is carried out, reference is now made, by way of preferred embodiments, to the accompanying drawings, in which.

DESCRIPTION OF THE PREFERRED EMBODIMENTS

Figure 1:
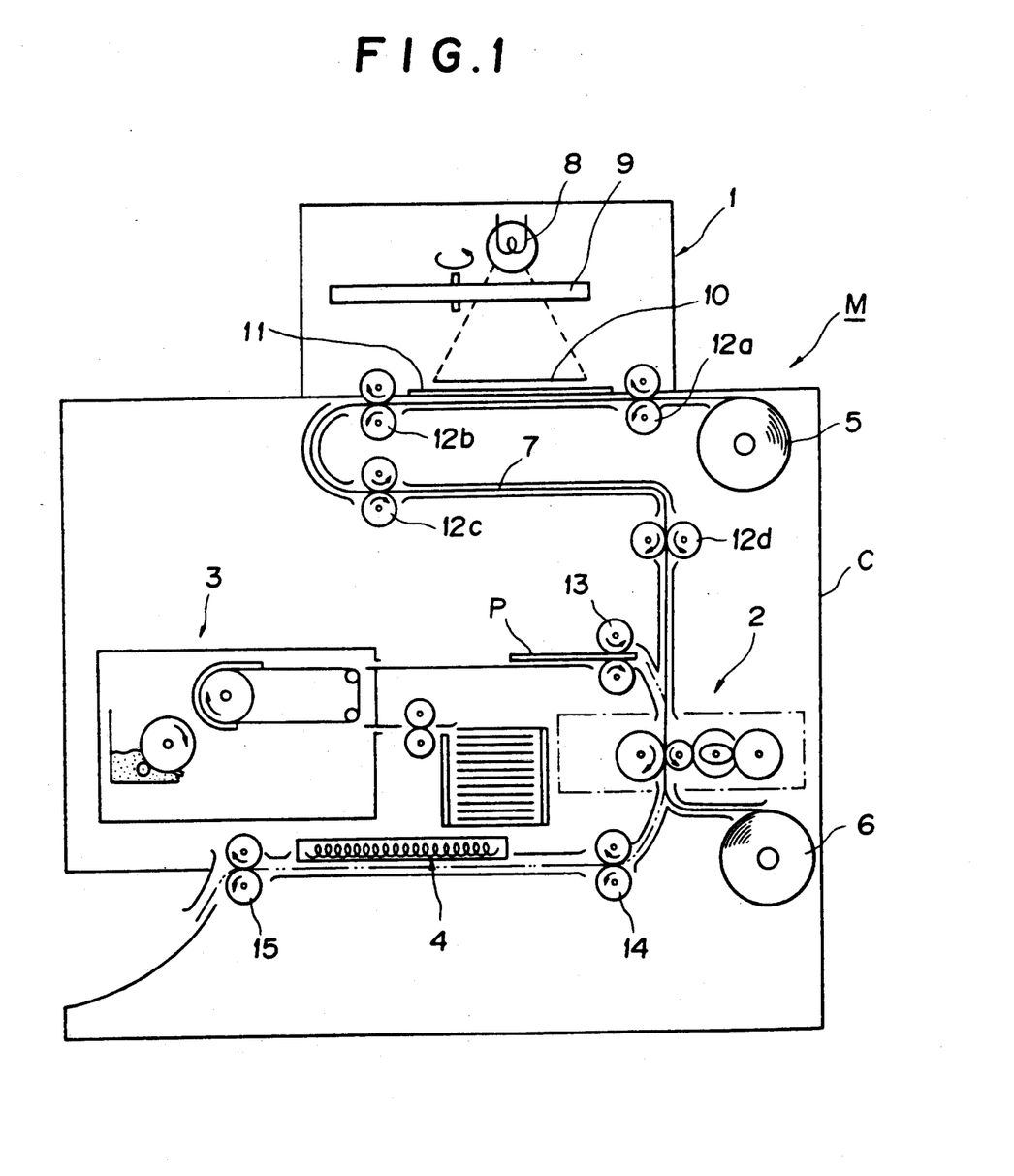
FIG. 1 is a schematic view of one example of a color image formation system provided with a pressure developing unit according to this invention.

FIG. 1 shows a color image forming system M as one type, i.e. so-called vertical type, copying machine equipped with a pressure developing unit of one embodiment according to this invention. The color image forming system includes an exposure unit 1 for exposing, through an original 10, a micro-capsule paper 7 as a photosensitive and pressure-sensitive medium traveling between a paper feed roller 5 and a winding roller 6. The color image forming system M has a casing C, and a pressure developing unit 2 is arranged at substantially the central portion of the casing C. A developer coating unit 3 is also disposed near the pressure developing unit 2.

In the pressure developing unit 2, the micro-capsule paper 7 exposed by the exposure unit 1 and the developer paper P as an image recording medium having a surface on which a developer is coated by the developer coating unit 3 are overlapped under pressure application to thereby transfer the color image developed on the micro-capsule paper 7 onto the developer paper P. The developer paper P after being subjected to the pressure developing treatment is fed to a heat fixing unit 4 to thereby fix the color image.

The exposure unit 1 includes a halogen lamp 8 under which is disposed a rotatable color separation filter 9 for three primary colors, for example. An original 10 is disposed on an original table 11 arranged below the color separation filter 9. A pair of guide rollers 12a and 12b are disposed on bilateral sides of the original table 11. The micro-capsule paper 7 exposed at the lower portion of the exposure unit 1 is fed to the pressure developing unit 2 through a pair of guide rollers 12a and 12d disposed downstream side of the guide rollers 12a and 12b.

The developer paper P with the developer being coated by the developer coating unit 3 is fed into the pressure developing unit 2 by means of a pair of guide rollers 13 with the micro-capsule paper 7 being pressure contacted to the developer paper P. In the pressure developing unit 2, the developer paper P in the overlapped condition is subjected to the pressure developing operation and the color image on the micro-capsule paper 7 is transferred onto the developer paper P.

The micro-capsule paper 7 passing the pressure developing unit 2 is wound up around a wind-up roller 6 and on the other hand, the developer paper P passing the pressure developing unit 2 is fed to a heat fixing unit 4 to carry out the image fixing operation and thereafter discharged externally by means of a pair of guide rollers 15.

Figure 2:
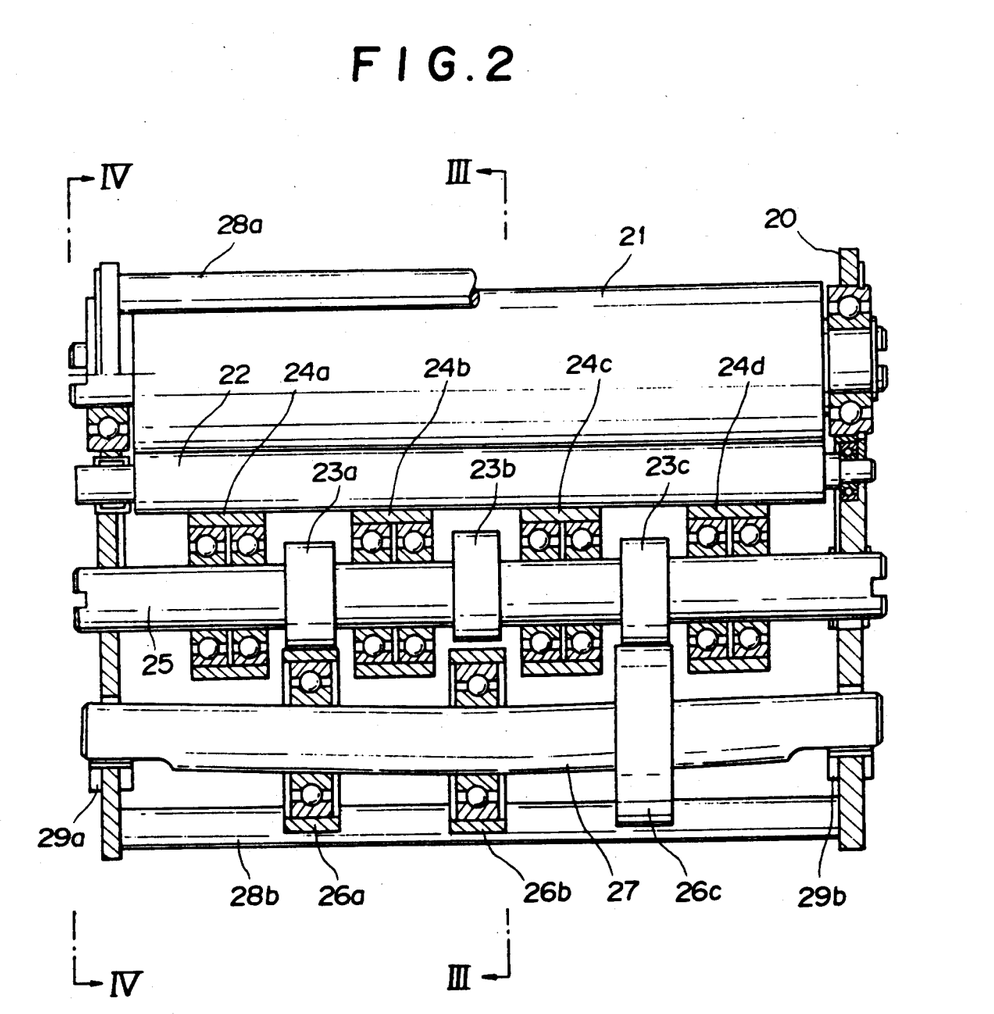
FIG. 2 is a partially sectional view of the pressure developing unit shown in FIG. 1.
Figure 3:
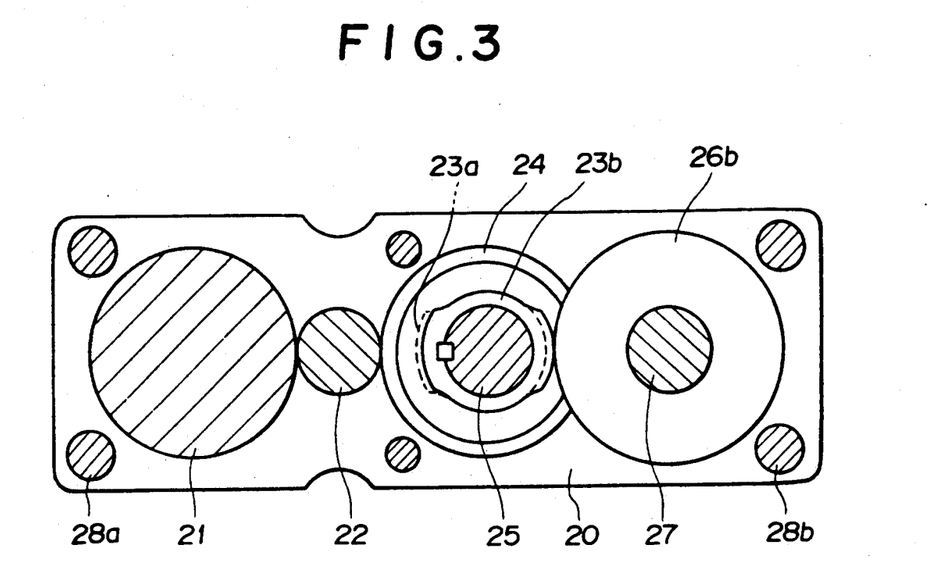
FIG. 3 is a sectional view taken along the line III—III shown in FIG. 2.
Figure 4:
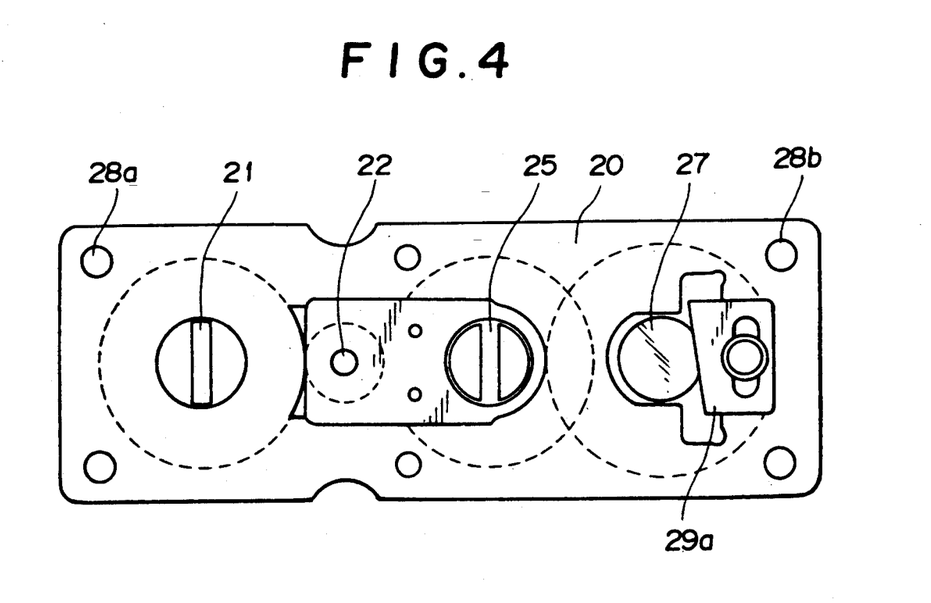
FIG. 4 is a side view of the pressure developing unit viewed from the direction IV—IV shown in FIG. 2.

One embodiment of the pressure developing unit according to this invention will be described hereunder with reference to FIGS. 2 to 4.

The pressure developing unit comprises a large diameter roller 21 as a first roller secured to a frame 20 to be rotatable about its rotation axis and a small diameter roller 22 as a second roller disposed to be rotatable about its rotation axis parallel to the rotation axis of the large diameter roller 21 so that the small diameter roller 22 can contact to or separate from the large diameter roller 21. The small diameter roller 22 is disposed to be movable to a first position where the small diameter roller 22 contacts with the large diameter roller 21 and to a second position where the small diameter roller 22 separates from the large diameter roller 21. The pressure developing unit according to this invention further comprises a cam assembly including a cam shaft 25 as a cam supporting means disposed to be rotatable about its rotation axis so as to contact to or separate from the small diameter roller 22 and a cam follower shaft 27 supported by the frame 20 so as to contact to or separate from the cam shaft 25.

The cam assembly further includes a plurality of cams, three cams 23a, 23b and 23c in the illustration, which are mounted on the outer periphery of the cam shaft 25 and a plurality of bearings, four bearings 24a, 24b, 24c and 24d in the illustration, for transmitting pressure to the small diameter roller 22, which are also mounted on the outer periphery of the cam shaft 25. The cams 23a to 23c are set so that the cams 23a and 23c have the same phase in the cam shaft rotating direction and the cams 23a and 23b have phase different with each other by 180° in the cam shaft rotating direction.

A plurality of bearings, three bearings 26a, 26b and 26c in the illustration, for supporting the cams 23a, 23b and 23c, respectively, are mounted on the outer periphery of the cam follower shaft 27. According to the described arrangement, the cams 23a and 23c or the cam 23b is selectively pressure contacted to the bearings 26a and 26c or the bearing 26b by rotating the cam shaft 25.

The pressure developing unit according to this invention further comprises wedge means 29a and 29b disposed near portions of the frame 20 at which the cam follower shaft 27 is supported for adjusting the distance between the cam shaft 25 and the cam follower shaft 27 and also comprises guide shafts 28a and 28b supporting the frame 20. The wedge means 29a and 29b in this meaning constitute a distance adjusting means. The cam follower shaft 27 and the bearings 26a to 26c mounted thereon constitute a pressure applying means which applies a pressure to the smaller diameter roller 22 in the utilization of returning force due to elastically deformable property.

Figure 5:
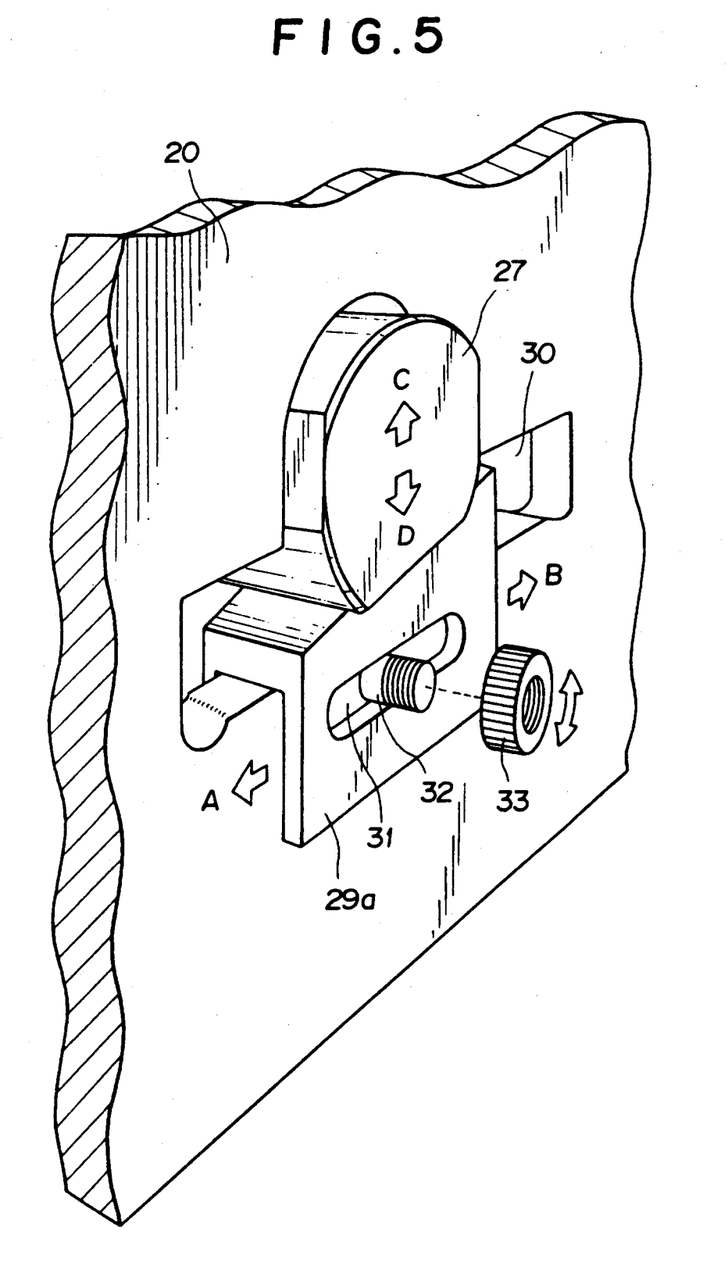
FIG. 5 is a perspective view of a wedge means applied to the pressure developing unit shown in FIG. 2.

The wedge means 29a (29b) is shown in detail in FIG. 5 as a perspective view.

Referring to FIG. 5, the wedge means 29a is composed of an inclined flat portion and a vertical portion supporting the inclined portion and the inclined portion abuts against the lower peripheral surface of the cam follower shaft 27. The frame 20 is provided with a slit 30 as an elongated hole and the wedge means 29a (29b) is inserted into the slit 30 so as to ride on a portion constituting the wall of the the slit 30 to be movable in the longitudinal direction thereof (A-B direction). The vertical portion of the wedge means 29a is provided with a slit 31 as an elongated hole into which is inserted a projection 32 located at a portion of the frame 20 corresponding to the location of the slit 31. Accordingly, the wedge means 29a (29b) can be moved till the longitudinal inner ends of the slit 31 abut against the projection 32. The projection 32 has a front end on which are formed male threads with which female threads of a clamping screw 33 is screw engaged, thus adjusting the movement of the wedge means 29a (29b) and securing the same at the clamping position.

The operation of the pressure developing unit of the character described above will be explained hereunder.

The micro-capsule paper 7 and the developer paper P are fed and then pressed into the gap between the large and small diameter rollers 21 and 22 with the papers 7 and P being overlapped. In a case where the developer paper P has an A4 size, for example, the cams 23a and 23c are selected by rotating the cam shaft 25 and where the developer paper P is of a B5 size, for example, the cam 23b is selected so as to change the distribution of the pressure to be applied in the axial direction of the rollers in accordance with the width sizes of the papers. The cam follower shaft 27 is elastically bent and deformed due to the pressure contact of the cams 23a and 23c or 23b to the bearings 26a and 26c or 26b mounted on the cam follower shaft 27. During these operations, in accordance with the amount of the elastic deformation of the cam follower shaft 27 at positions corresponding to those of the bearings 26a to 26c, a force to return the deformation to the original position is always applied from the bearings 26a to 26c to the cams 23a to 23c. This return force is transferred to the bearings 24a to 24c as pressure applying force to the rollers 21 and 22.

The pressure distribution to the rollers can be adjusted by changing the positions on the curves of the contours of the cams 23a to 23c being pressed to the bearings 26a to 26c by rotating the cam shaft 25 by desired angles and thereby adjusting a distance between the positions on the curves and the axis of the cam shaft 25. Furthermore, the pressure distribution can be also adjusted by changing a distance between the cam shaft 25 and the cam follower shaft 27 by the adjustment of the wedge means 29a and 29b, i.e. a distance between the cams 23a to 23c and the bearings 26a to 26c by shifting the wedge means as described with reference to FIG. 5.

Accordingly, when the large and small diameter rollers 21 and 22 are rotated by driving means not shown, the elastic return force of the cam follower shaft 27 is always applied to the small roller 22 by means of the bearings 24a to 24d, whereby the predetermined pressure distribution between the large diameter roller 21 and the small diameter roller 22 can be maintained.

Accordingly, the crinkling of papers and the uneven development can be effectively prevented by passing, between the thus pressure adjusted rollers 21 and 22, the micro-capsule paper 7 as the photosensitive and pressure-sensitive medium and the developer paper P, overlapped with the paper 7, as the image recording medium, resulting in the accurate pressure development state without causing any trouble or inconvenience.

In these operation, the pressure application to the rollers 21 and 22 can be adjusted by operating the wedge means 29a and 29b alone or together with the operation of the cam assembly described above. The wedge means 29a and 29b are operated manually or by driving means not shown. Namely, when the wedge means 29a and 29b are moved in the slit 30 of the frame 20 in the A-B direction, the cam follower shaft 27 is moved in the C-D direction so as to come into contact to or separate from the cam shaft 25. The distances between the cams 23a to 23c and the corresponding bearings 26a to 26c can be therefore changed by fixing the wedge means 29a and 29b by clamping the clamp screw 33. Accordingly, the elastic return force of the cam follower shaft 27 is changed in accordance with the elastic deformation of the cam follower shaft 27 by shifting the fixing positions of the wedge means 29a and 29b in the slits 30 along the longitudinal directions thereof, resulting in the adjustment of the pressure application to the small diameter roller 22. The application and adjustment of the wedge means can solve the manufacturing or working errors of the cams and moreover, the combined adjustments of the rotation position of the cam shaft 25 and the fixing positions of the wedge means 29a and 29b result in the optional adjustment of the distribution of the pressure applied to the small diameter roller in the axial direction thereof.

It is to be noted that the numbers, the shapes and the structures of the cam shaft, the cam follower shaft, the cams and the bearings are not limited to those of the described embodiment. Namely, for example, there may be adapted any operation mode or example in which the elastic return force of the cam follower shaft bent by the cam or the like is utilized as a pressure to be applied to the rollers in the pressure developing unit and the distribution of the pressure to be applied to the rollers can be adjusted by adjusting the distance between the contour curves of the cams 23a to 23c at positions at which the cam are pressed by the bearings 26a to 26c and the axis of the cam shaft 25. Accordingly, it is not absolutely necessary to arrange the cam shaft 25 and the second roller parallelly to each other and a crank shape arrangement may be adapted.

Furthermore, since the roller pressing force is transferred while rotating the bearings 24a to 24d, it is necessary for the cam shaft 25 to be rotated for the selection of the cams being arranged with different phases, for example, shifted by 180°, but it is not necessary for the cam follower shaft 27 to be rotatable. Accordingly, a cam follower shaft of a flat spring shape may be adapted as the cam follower shaft 27 and in such case, the bearings 26a to 26c may be eliminated and it is required for the flat spring type cam follower shaft to be provided with protruded portions for engaging and supporting the cams 23a to 23c.

As can be understood from the foregoing descriptions, in general, it may be said that any means which is elastically deformable by the application of the compression force and causes a reaction force in accordance with the deformed amount may be disposed at portions against which the cams 23a to 23c abut. Accordingly, coil spring means, which is disposed at portions against which the cams 23a to 23c abut, may be substituted for the cam follower shaft 27 and the bearings 26a to 26c.

In the described embodiment, although the combination of the large and small diameter rollers 21 and 22 is adapted as the first and second rollers, the combination is not limited to the described type and any other combination may be adapted without departing from the scope of this invention.

Furthermore, in the described embodiment, the wedge means 29a and 29b of the character shown in FIG. 5 is utilized as the distance adjusting means for adjusting the distance between the cam follower shaft 27 and the bearings 26a to 26c, any other means other than wedge means of the described type may be adopted as the distance adjusting means. For example, adjusting screw means movable in the cams 23a to 23c and the cam shaft 27 may be provided for the cam follower shaft 27.

As described hereinbefore, according to this invention, the return force for the deformation of the cam follower shaft is utilized as the pressurizing force to the roller of the pressure developing unit and the pressure distribution of the roller can be adjusted by adjusting the distance between the contour curve and the axis of the cam shaft at the press contact points of the bearings by the wedge means, so that the construction of the pressure developing unit can be made compact in comparison with the conventional structure of the pressure developing unit.

Accordingly, elements or parts constituting the pressure developing unit can be reduced, thus making compact the same with reduced weight. In addition, the manufacturing cost involving working and assembling costs can be reduced and the reduced utilization of the constructional elements results in the lowering of the generation of the faults of the pressure developing unit, thus being effective.

Moreover, the working error in the cam producing process can be substantially eliminated by adjusting the wedge means, whereby the reliability of the pressure developing unit and hence the color copying machine can be significantly improved.

Figure 6:
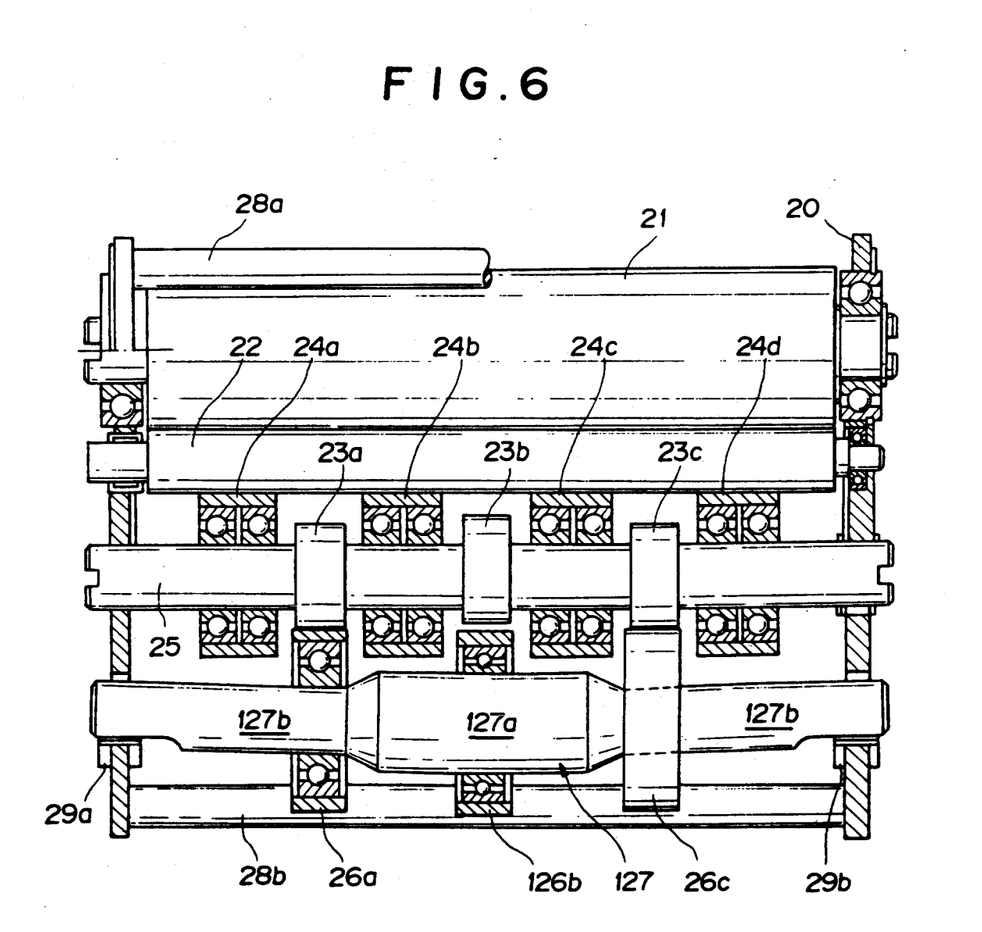
FIG. 6 is a view similar to that of FIG. 2 according to another embodiment of this invention.

Referring to FIG. 6, a cam follower shaft 127 is constructed as a rod like member having a cross sectional area uneven in the axial direction thereof and the cam follower shaft 127 of this construction is subjected to the elastic deformation in press contact to the cams 23a to 23c to thereby apply the pressure to the cams 23a to 23c.

Namely, as shown in FIG. 6, the cam follower 127 has the central portion 127a having a diameter larger than that of the side portions 127b, that is, the cross sectional area of the central portion 127a is larger than the cross sectional areas of both the axially side portions 127b. Accordingly, the central portion 127a has a rigidity higher than that of the side portions 127b, thus the central portion being liable to be hardly bent in comparison with the side portions. A bearing 126b is mounted to the central portion 127a of the cam follower shaft 127. Accordingly, in a case where it is assumed that the distance between the press contact position on the cam contour curve of the cam 23b corresponding to the central portion 127a of the cam follower shaft 127 with respect to the bearing 126b and the axis of the cam shaft 25 is equal to that of the substantially straight rod like member having an even cross section, a larger elastically return force can be generated according to this embodiment shown in FIG. 6. Therefore, according to this embodiment, the adjustment of the distribution of the pressure applied to the roller can be performed by the cam follower shaft having uneven distances between the cam contour curves and the cam shaft axis at the press contact points to the bearings and having uneven axial cross sectional areas, thus the construction of the pressure developing unit can be further simplified.

Accordingly, elements or parts constituting the pressure developing unit can be reduced, thus making compact the same with reduced weight. In addition, the manufacturing cost involving working and assembling costs can be reduced and the reduced utilization of the constructional elements results in the lowering of the generation of the faults of the pressure developing unit, thus being effective.

FIGS. 7 to 10 represent another embodiment of a pressure developing unit according to this invention applied to another type, i.e. so-called horizontal type, copying machine.

Figure 7:
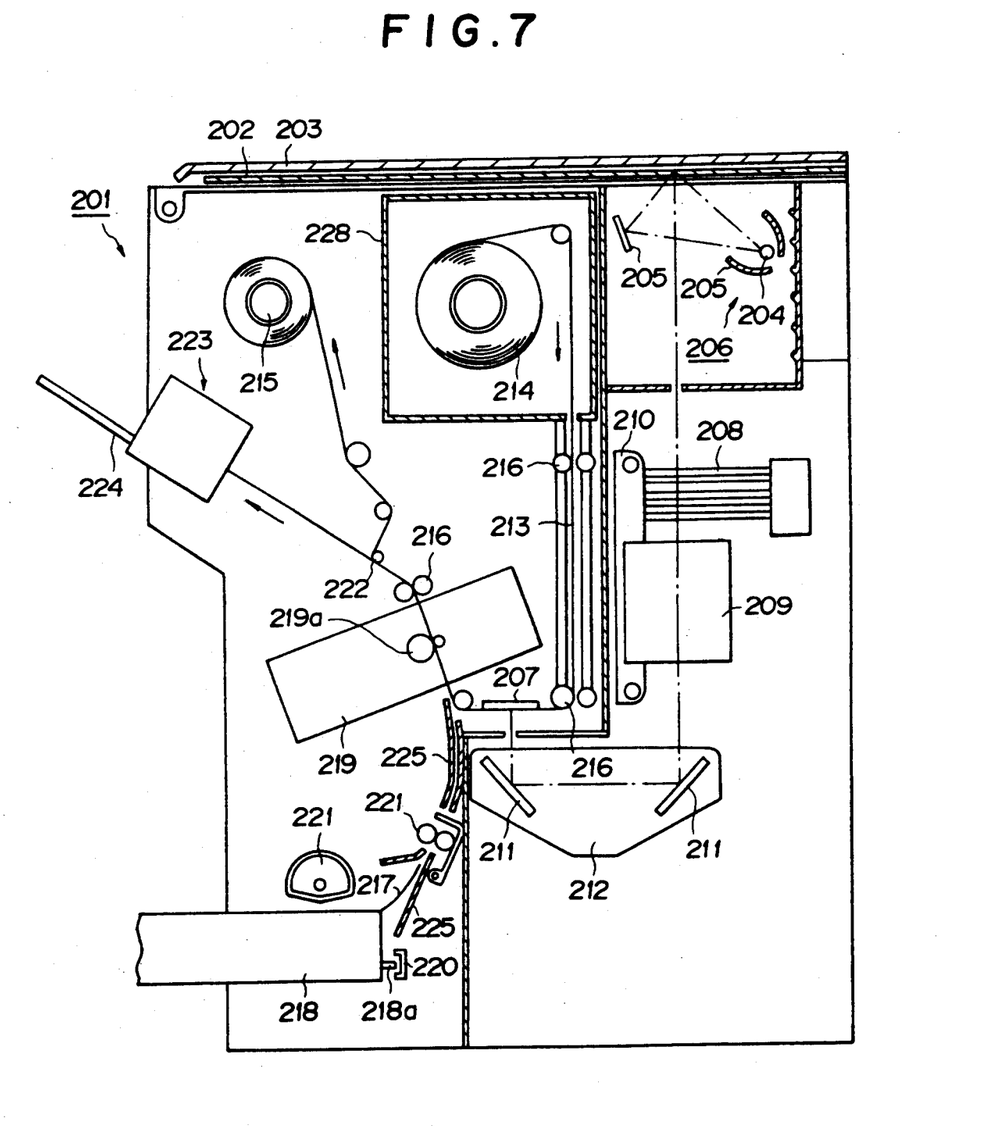
FIG. 7 is a schematic view of another example of a color image formation system provided with a pressure developing unit of this invention.

Referring to FIG. 7, a copying machine is provided with a machine body 201 and an original table 202 made of a glass material on which an original is rested is disposed above the machine body 201. The original table 202 is covered by a cover 203 which is bilaterally movable. A light source 206 is disposed below the original table 202 and the light source 206 comprises a halogen lamp 204 extending in a direction normal to the moving direction of the original table 202 and irradiating the light to the original on the table 202 and a reflecting mirror 5 for reflecting the light from the halogen lamp 204 towards the original table 202. The original rested on the original table 202 can be entirely irradiated by the light from the light source 206 by bilaterally moving the original table during the light irradiation period.

An exposure table 207 is arranged at substantially the central portion of the copying machine body 201. A filter 208 for adjusting tone of a copy image and a condenser lens 209 are supported by a support plate 210 at a portion between the exposure table 207 and the light source 206, and a pair of reflecting mirrors 211 for adjusting the light passage length and the focusing operation are supported by a support plate 212 to be positionally adjustable between the condenser lens 209 and the exposure table 207. The light reflected by the original is guided to the exposure table 207 through the filter 208, the condenser lens 209 and the reflecting mirrors 211.

A cassette 228 in which a cartridge 214 is accommodated is detachably mounted at an upper portion in the copying machine body 201 and a wind-up roller 215 is also accommodated to be rotatable. To the cartridge 214 is wound up an elongated photosensitive and pressure-sensitive recording medium such an elongated tape like micro-capsule paper 213 carrying a plurality of micro-capsule including color agents for the color copy. The micro-capsule paper 213 is taken out from the cartridge 214 by the rotation of a roller 216 and then wound up around a wind-up roller 215. During this operation, a portion of the micro-capsule paper 213 passing below the exposure table 207 is exposed and a latent image of the original is formed thereon.

A developer paper cassette 218 accommodating developer papers 217, each in sheet form, having an constant size is detachably mounted below the exposure table 207 of the machine body 201 and a pressure developing unit 219 is arranged between the exposure table 207 and the wind-up roller 215. The pressure developing unit 219 includes a pressure applying roller 219a by which the micro-capsule paper 213 and the developer paper 217 are press contacted to each other. During this operation, the roller 219a is loaded with a pressure higher than 700 kg/cm$^2$. According to this manner, a color image on the basis of the latent image, i.e. exposed portion, on the micro-capsule paper 213 is transferred on the developer paper 217. The developer paper 217 is prepared by coating a developing agent on a base material to thereby form a heat fusible resin layer on the surface of the developer. A paper having a small heat capacity and a polyethylene terephthalate (PET) having a large heat capacity may be preferably utilized as the base material for the developer paper 217. The developer paper cassette 218 is provided with a projection 218a for discriminating the size of the developer paper 217 and a discriminator 220 for discriminating the size of the projection 218a, i.e. the size of the developer paper 217, is disposed in the machine body 201.

A plurality of feed rollers 221 and a paper guide 225 for conveying and guiding the developer paper 217 towards the pressure developing unit 219 are arranged between the developer paper cassette 218 and the pressure developing unit 219. A release roller 222 for releasing the developer paper 217 from the micro-capsule paper 213 is disposed on the paper feed-outside of the pressure developing unit 219. A sheet heating unit 223 for heat fixing the image formed on the developer paper 217 is also disposed on the paper feedout side of the release roller 222 and the developer paper 217 discharged from the sheet heat unit 223 is accommodated in a tray 224.

When it is desired to prepare a color copy by utilizing the color copying machine of the structure described above, a start button, not shown, is first depressed. The original table 202 made of glass is moved to the righthand end, as viewed, at which the lefthand end of the original is positioned at a portion opposing to the halogen lamp 204 of the light source 206. The halogen lamp 204 is then lightened and, under the condition, the original table 202 is moved leftwardly, thus completing the light irradiation of the halogen lamp 204 to the original.

During the light irradiation, the micro-capsule paper 213 is moved on the exposure table 207 towards the wind-up side at the same moving speed as that of the original table 202, thereby forming the latent image of the original on the micro-capsule paper 213 by the reflected light from the original. The developer paper 217 is moved from the developer paper cassette 218 towards the pressure developing unit 219 in synchronism with the leftward movement of the original table 202, and the color image is formed on the developer paper 217 by the press contact of the exposed portion of the micro-capsule paper 213 to the developer paper 217. The developer paper 217 is thereafter guided in the sheet heating unit 223 by means of feed roller 216 and the color image is fixed therein by applying heat. The developer paper 217 is thereafter discharged from the sheet heating unit 223.

During the pressure developing operation by the pressure developing unit 219, it is necessary to apply uniform pressure to the micro-capsule paper 213 because it is pressed by the pressure applying roller 219a with a high load more than 700 kg/cm$^2$.

Figure 8:
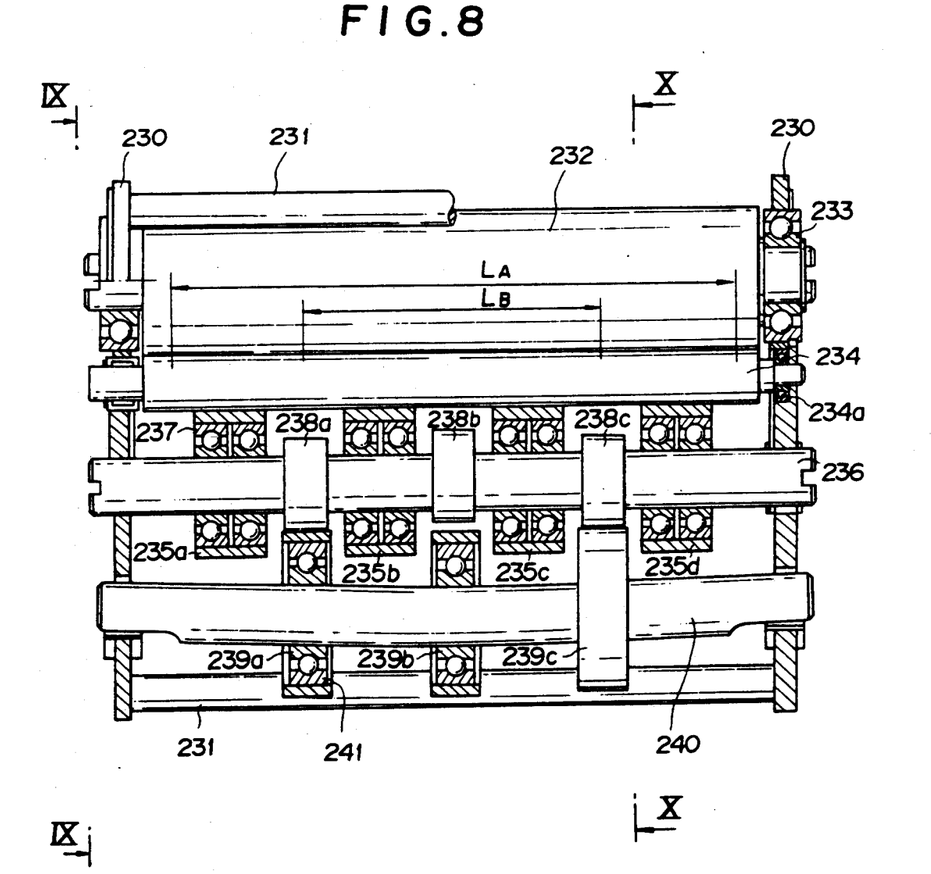
FIG. 8 is a view similar to that of FIGS. 2 or 6 according to a further embodiment of this invention.
Figure 10:
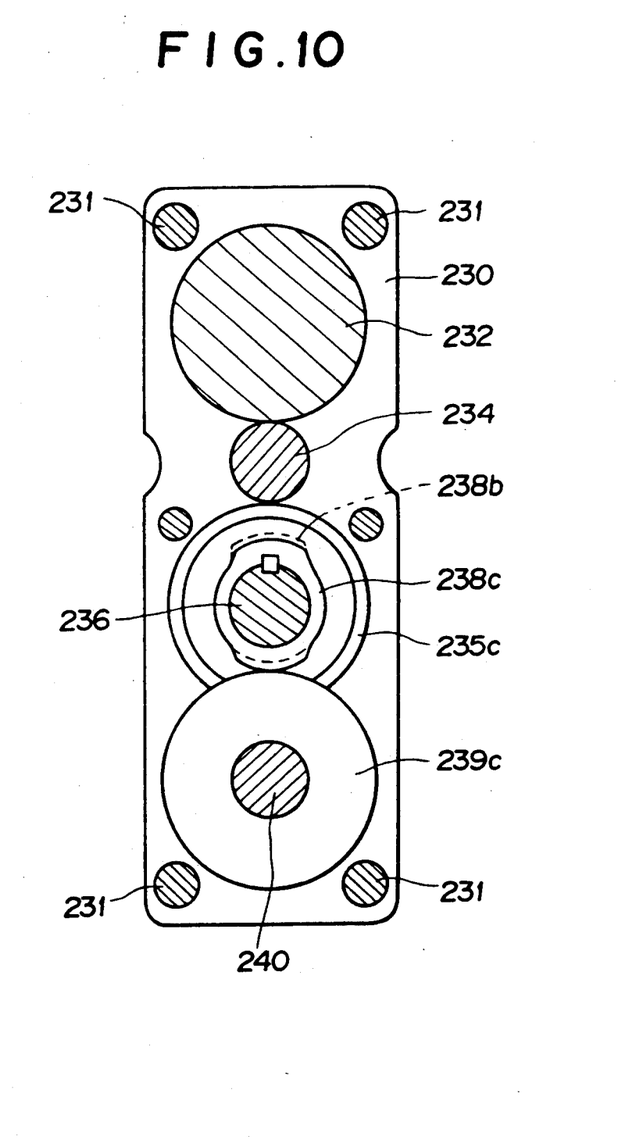
FIG. 10 is a sectional view taken along the line X—X shown in FIG. 8.

Referring to FIG. 8 showing a sectional view of an essential structure of the pressure developing unit 217 according to this invention. Reference numeral 230 designates a pair of frames which are stationarily supported with spaces by a plurality of guide shafts 231, 231 ... 231 (FIG. 10). A large diameter roller 232 is supported at the upper portion of the frames 230 to be rotatable through a bearing 233 and a small diameter roller 234 is disposed below the large diameter roller 232 in the abutting manner and supported by the frames 230 to be rotatable through a bearing 234a.

Four back-up rollers 235a, 235b, 235c and 235d abutting against the small diameter roller 234 are mounted to a cam shaft 236 rotatably supported by the frames 230 through a bearing 237 at a portion below the small diameter roller 234. Three cams 238a, 238b and 238c are mounted to the cam shaft 236 at portions between the respective back-up rollers 235. The cams 238 are disposed in a manner such that the cams 238a and 238c has the same phase and the cam 238b has a phase offset by 180° with respect to those of the cams 238a and 238c.

A plurality of cam followers 239 respectively abutting against the cams 238 are rotatably mounted through a bearing 241 to a cam follower shaft 240 supported by the frames 230. Wedge means 242 are disposed at the supporting portion of the cam follower shaft 240 to the frames 230 so as to adjust the vertical, as viewed, position of the cam follower shaft 240.

Figure 9:
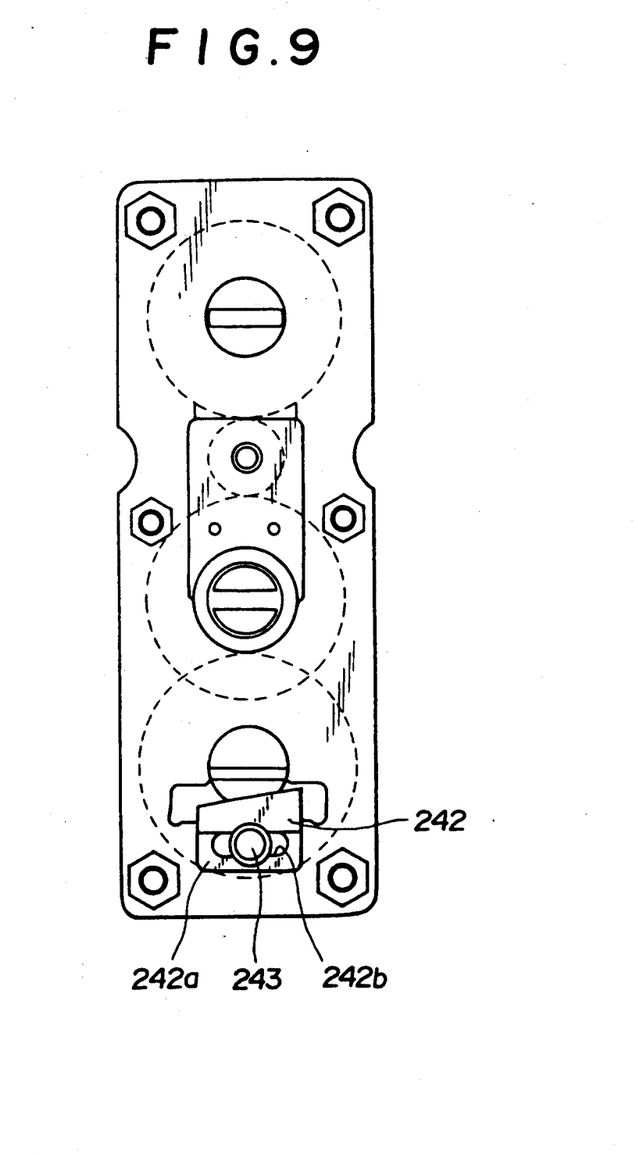
FIG. 9 is a side view of the pressure developing unit viewed from the direction IX—IX shown in FIG. 8.

As shown in FIG. 9, a slit as an elongated hole 242b is formed in parallel to the inclination of the wedge means 242 at the supporting portion 242a thereof and a position adjusting screw 243 is screw engaged with the slit 242b.

The operation of the pressure developing unit of this embodiment of the characters described above will be explained hereunder.

When an A size paper having a width $L_A$ is utilized, the cam shaft 236 is adjusted so that the cams 238a, 238b and 238c do not abut against the corresponding cam followers 239a, 239b and 239c. Under this condition, the micro-capsule paper and the developer paper each having an A size are fed between the large and small diameter rollers 232 and 234. A detector, not shown, detects the fact that the developer paper has the A size. The cam shaft 336 is then rotated so that the cams 238a and 238c abut against the cam followers 239a and 239c. At this time, since the cam 238a is offset in the phase by 180° with respect to the other cams 238a and 238c, the cam 238b does not abut against the cam follower 239b. Since the cam follower shaft 240 now supporting the cam followers 238a and 238c is constructed as a fixed shaft, the cams 238a and 238c are pushed upwardly, as viewed, and the back-up rollers 235a to 235d are also moved upwardly through the cam shaft 236. The small diameter roller 234 is therefore pressed towards the large diameter roller 232, thus performing the pressure developing operation.

On the other hand, when a B size paper having a width $L_B$ is utilized, the cam shaft 236 is adjusted so that the cams 238a, 238b and 238c do not abut against the corresponding cam followers 239a, 239b and 239c. Under this condition, the micro-capsule paper and the developer paper having a B size are fed between the large and small diameter rollers 232 and 234. A detector, not shown, detects the fact that the developer paper has the B size. The cam shaft 236 is then rotated so that the cam 238b abuts against the cam follower 239b. At this time, the cam 238b is pushed upwardly, as viewed, and the back-up rollers 235a to 235d are also upwardly moved through the cam shaft 236. The small diameter roller 234 is therefore pressed towards the large diameter roller 232, thus performing the pressure developing operation.

As described above, the supporting portions of the cam shaft 236 are changed by the utilization of the cams 238a to 238c in accordance with the paper sizes A and B. Accordingly, the pressure developing unit according to this embodiment can be easily operated by changing the pressure distribution in accordance with the widths $L_A$ and $L_B$ of the papers.

Moreover, in a case when a controlling means for adjusting the vertical movement of the wedge means 242, it may be possible to dispose a plurality of cams 238 on the cam shaft 236 and to set the vertical movement amount of the wedge means to be more than the lift amount of the cams 238, thereby freely selecting the positions of the cams to be operated. In this modification, the pressure distribution and the applying pressure can be optionally adjusted, thus being suitable for use in wide range.

In the described embodiment, the back-up rollers 235a to 235d are constructed to abut against the small diameter roller 234, but they may be constructed to abut against the large diameter roller 232.

In the foregoing descriptions, the some embodiments of the pressure developing units were described with reference to the image formation system as a color copying machine shown in FIG. 1 and others were described with reference to another type color copying machine shown in FIG. 7, but these embodiments of the pressure developing units can be utilized to both the color copying machines without any substantial trouble or problem.

It is to be understood that this invention is not limited to the described embodiments and many other changes and modifications may be made without departing from the scope of the appended claims.

What is claimed is:

1. A pressure developing unit of an image formation system for developing and transferring an image under application of pressure, comprising:
   a frame member;
   a first roller supported by said frame member to be rotatable about a rotation axis thereof;
   a second roller supported by said frame member and having a rotation axis parallel to the rotation axis of said first roller to be rotatable about the rotation axis thereof, said second roller being disposed to be movable to a first position where the second roller contacts with the first roller and to a second position where the second roller separates from the first roller, an image recording sheet being passed between the second roller and the first roller; and
   a cam assembly operatively supported by said frame member for applying pressure to said second roller;
   said cam assembly comprising cam support means disposed to be movable in directions approaching to and being separated from said second roller, a plurality of cams mounted to said cam support means, elastically deformable means supported by said frame member for applying pressure to said cams by elastic deformation caused by contact by said cams, means mounted to said cam support means for transferring the pressure caused by said elastically deformable means, and means for adjusting a distance between said cam support means and said elastically deformable applying means;
   said distance adjusting means comprising wedge means fitted into bilaterally elongated holes formed in said frame member at portions near supported end portions of said elastically deformable means to be movable in a bilateral direction of the holes, each of said wedge means comprising a flat portion having an inclined surface against which the end portion of said elastically deformable means slidably abuts and a vertical portion extending vertically from the flat portion.

2. A pressure developing unit according to claim 1, wherein said cam support means comprises a cam shaft supported to said frame member, said elastically deformable means comprises a cam follower shaft and a plurality of bearing means mounted to said cam follower shaft at portions corresponding to locations of said cams mounted to said cam shaft, and said pressure transferring means comprises a plurality of bearing means mounted to said cam shaft.

3. A pressure developing unit according to claim 2, wherein said cams are mounted to said cam shaft in phase shifted state so as to selectively contact corresponding bearing means mounted to said cam follower shaft.

4. A pressure developing unit according to claim 3, wherein the selective contact of said cams to said bearing means of the cam follower is performed in accordance with sizes of the image recording sheet.

5. A pressure developing unit according to claim 4, wherein said image recording sheet includes a photosensitive and pressure-sensitive medium and an image recording medium, said photosensitive and pressure-sensitive medium is a micro-capsule paper and said image recording medium is a developer paper.

6. A pressure developing unit according to claim 1, wherein the vertical portion of said wedge means is provided with a bilaterally elongated hole and a projection is formed on said frame member so as to be inserted into the elongated hole of the vertical portion to limit the bilateral movement of said wedge means in the elongated hole formed in said frame member.

7. A pressure developing unit according to claim 1, wherein said first roller has a diameter larger than that of said second roller.

8. A pressure developing unit of an image formation system for developing and transferring an image under application of pressure, comprising:
a frame member;
a first roller supported by said frame member to be rotatable about a rotation axis thereof;
a second roller supported by said frame member and having a rotation axis parallel to the rotation axis of said first roller to be rotatable about the rotation axis thereof, said second roller being disposed to be movable to a first position where the second roller contacts with the first roller and to a second position where the second roller separates from the first roller, an image recording sheet being passed between the second roller and the first roller; and
a cam assembly operatively supported by said frame member for applying pressure to said second roller;
said cam assembly comprising cam support means disposed to be movable in directions approaching to and being separated from said second roller, a plurality of cams mounted to said cam support means, elastically deformable means supported by said frame member for applying pressure to said cams by elastic deformation caused by contact by said cams, means mounted to said cam support means for transferring the pressure caused by said elastically deformable means;
said elastically deformable means comprises a rod like member having both ends supported by said frame member and a plurality of bearing means mounted to said rod like member, said rod like member having a cross section uneven in an axial direction thereof.

9. A pressure developing unit according to claim 8, wherein said rod like member is composed of a central portion and side portions on both sides of the central portion each having a cross sectional area smaller than that of the central portion and said bearing means mounted respectively to the central portion and the both side portions of said rod like member.

10. A pressure developing unit according to claim 8, wherein said cam assembly further comprises means for adjusting a distance between said cam support means and said rod like member.

11. A pressure developing unit according to claim 10, wherein said distance adjusting means comprises wedge means fitted into bilaterally elongated holes formed in said frame member at portions near supported end portions of said rod like member to be movable in a bilateral direction of the holes, each of said wedge means comprises a flat portion having an inclined surface against which the end portion of said rod like member slidably abuts and a vertical portion extending vertically from the flat portion.

12. A pressure developing unit according to claim 11, wherein the vertical portion of said wedge means is provided with a bilaterally elongated hole and a projection is formed on said frame member so as to be inserted into the elongated hole of the vertical portion to limit the bilateral movement of said wedge means in the elongated hole formed in said frame member.

13. A pressure developing unit of an image formation system for developing and transferring an image under application of pressure, comprising:
a frame member;
a first roller supported by said frame member to be rotatable about a rotation axis thereof;
a second roller supported by said frame member and having a rotation axis parallel to the rotation axis of said first roller to be rotatable about the rotation axis thereof, said second roller being disposed to be movable to a first position where the second roller contacts with the first roller and to a second position where the second roller separates from the first roller, an image recording sheet being passed between the second roller and the first roller; and
a cam assembly operatively supported by said frame member for applying pressure to said second roller;
said cam assembly comprising cam support means disposed to be movable in directions approaching to and being separated from said second roller, a plurality of cams mounted to said cam support means, elastically deformable means supported to said frame member for applying pressure to said cams by elastic deformation caused by contact to said cams, means mounted to said cam support means for transferring the pressure caused by said elastically deformable means;
said cam support means comprises a cam shaft supported by said frame member, said elastically deformable means comprises a cam follower shaft and a plurality of bearing means mounted to said cam follower shaft at portions corresponding to locations of said cams mounted to said cam shaft, and said pressure transferring means comprises a plurality of back-up rollers mounted to said cam shaft on both sides of said cams respectively to be rotatable about said cam shaft; and said distance adjusting means comprising wedge means fitted into bilaterally elongated holes formed in said frame member at portions near supported end portions of said pressure applying means to be movable in a bilateral direction of the holes, each of said wedge means comprising a flat portion having an inclined surface against which the end portion of said elastically deformable means slidably abuts and a vertical portion extending vertically from the flat portion.

14. A pressure developing unit according to claim 13, wherein the vertical portion of said wedge means is provided with a bilaterally elongated hole and a projection is formed on said frame member so as to be inserted into the elongated hole of the vertical portion to limit the bilateral movement of said wedge means in the elongated hole formed in said frame member.

* * * * *